(12) United States Patent
Gloekler et al.

(10) Patent No.: US 7,913,136 B2
(45) Date of Patent: Mar. 22, 2011

(54) METHOD FOR PERFORMING A LOGIC BUILT-IN-SELF-TEST IN AN ELECTRONIC CIRCUIT

(75) Inventors: Tilman Gloekler, Guertringen (DE); Michael Kugel, Boeblingen (DE); Thuyen Le, Taufkirchen (DE); Matthias Woehrle, Bietigheim-Bissingen (DE)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 12/052,844

(22) Filed: Mar. 21, 2008

(65) Prior Publication Data
US 2008/0250289 A1 Oct. 9, 2008

(30) Foreign Application Priority Data
Apr. 3, 2007 (EP) .................................. 07105514

(51) Int. Cl.
*G01R 31/28* (2006.01)
(52) U.S. Cl. ........................... 714/728; 714/738
(58) Field of Classification Search .................. 714/726, 714/727, 728, 729, 732, 733, 734, 738
See application file for complete search history.

(56) References Cited

U.S. PATENT DOCUMENTS

| | | | | |
|---|---|---|---|---|
| 6,934,921 B1 * | 8/2005 | Gu et al. | ............................ | 716/6 |
| 7,490,280 B2 * | 2/2009 | Grise et al. | .................... | 714/733 |
| 7,721,172 B2 * | 5/2010 | Wang et al. | .................... | 714/729 |

OTHER PUBLICATIONS

"New Approach Moves logic BIST into Mainstream" by Kapur et al. Published in EETimes Oct. 14, 2002.*
Yung-Chieh Lin; Feng Lu; Kai Yang; Kwang-Ting Cheng; , "Constraint extraction for pseudo-functional scan-based delay testing," Design Automation Conference, 2005. Proceedings of the ASP-DAC 2005. Asia and South Pacific , vol. 1, no., pp. 166-171 vol. 1, Jan. 18-21, 2005 doi: 10.1109/ASPDAC.2005.1466151.*
"Built-In Constraint Resolution", Grady Giles, Joel Irby, Daniela Toneva, and Kun-Han Tsai, International Test Conference, IEEE, 2005.
"Testing Digital Circuits with Constraints" Al-Yamani, Mitra, and McCluskey, CRC Technical Report, IEEE, 2002.

* cited by examiner

*Primary Examiner* — Cynthia Britt
(74) *Attorney, Agent, or Firm* — Dennis Jung; Lynn Augspurger (57) ABSTRACT

The present invention relates to a method for performing a logic built-in self-test (LBIST) on an electronic circuit with a plurality of logic circuits (18, 20, 22, 24) and storage elements (14, 16) connected serially to a number of LBIST stumps (10, 12) between a pseudo-random-pattern generator (26) and a multiple-input-signature register (28), wherein at least one constrained logic circuit (18) requires constrained values as input signals. Said method comprises the following steps: scanning the LBIST stumps (10, 12) with the pseudo-random-pattern generator (26), deactivating the multiple-input-signature register (28), performing a functional update in order to propagate legal values into those storage elements (16), which require constrained values, activating or resetting (51) the multiple-input-signature register (28), and setting or programming a start value in a counter (42) for activating a loop back circuit (34) in order to avoid an overwriting of the well-constrained values in the storage elements (16).

18 Claims, 5 Drawing Sheets

METHOD FOR PERFORMING A LOGIC BUILT-IN-SELF-TEST IN AN ELECTRONIC CIRCUIT

BACKGROUND OF THE INVENTION

1. Field of the Invention

The present invention relates to a method for performing a logic built-in-self-test on electronic circuits, especially on integrated circuits. Further the present invention relates to an electronic circuit with a plurality of storage elements and logic circuits and at least a logic built-in-self-test engine.

2. Description of the Related Art

Integrated semiconductor circuits comprise a plurality of storage elements and logic circuits. The storage elements may be realized as flip-flop elements, for example. The logic circuits may be realized as gate logic circuits. During the manufacturing the integrated circuits have to be tested in order to detect defects on the integrated circuit. An example of such a method is a logic built-in-self-test (LBIST). The logic built-in-self-test allows the test of the chip logic at the clock speed of the system.

The LBIST uses pseudo-random pattern generators (PRPG) to initialize LBIST-able scan chains, referred to as LBIST stumps. The LBIST stump is formed by a plurality of scan-able storage elements. Like other storage elements the scan-able storage element comprises a data input and a data output. Additionally the scan-able storage element comprises a scan input and a scan output. The scan output of one scan-able storage element is connected to the scan input of the next scan-able storage element. In this way the scan-able storage elements form the LBIST stump.

The PRPG generates pseudo-random patterns. Said pseudo-random patterns are driven into the LBIST stumps. The PRPG initializes the LBIST stumps through their scan inputs at the maximum scan frequency. Subsequently, the LBIST switches to the system clock frequency of the product and exercises the functional logic between the LBIST stumps and updates the storage elements of the LBIST stumps. After the functional logic updates, the LBIST stumps scan out the updated values into multiple-input-signature registers (MISR), while simultaneously scanning in new values from the PRPG. The results from the LBIST stump are serially compressed into the MISR. The registers of the MISR capture a signature that is used to identify faults after running enough LBIST iterations.

The non-deterministic nature of the PRPG data causes a problem for those parts of the logic circuit, which require special constraints on the data values. For example, a pass-gate multiplexer needs a one-hot or all zero input value in its control register in order to avoid short circuits within the multiplexer. Other circuits are prone to voltage drops, when operating with illegal data values like on-chip memories that have more than a single word-line asserted at a time.

Figure 6:
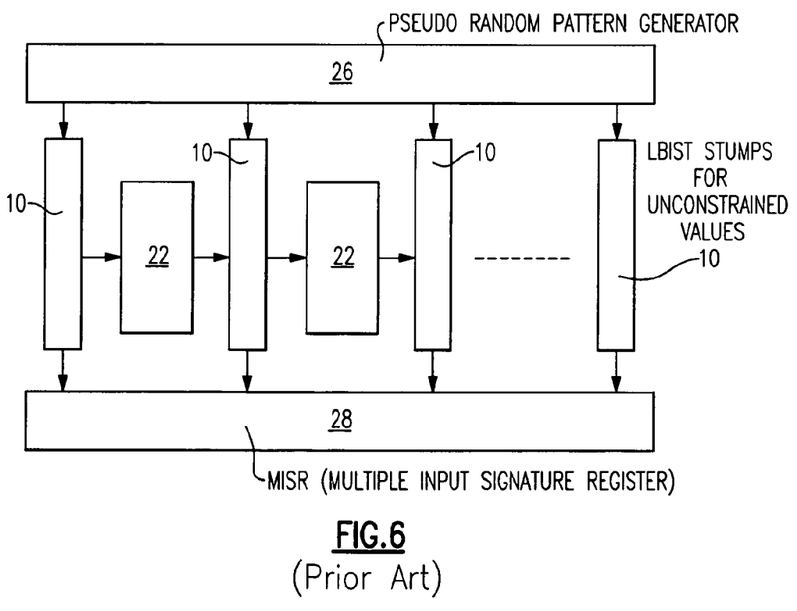
FIG. 6 illustrates a schematic diagram of a conventional logic built-in-self-test structure according to the prior art.

FIG. 6 illustrates a schematic diagram of a conventional LBIST structure. A number of LBIST stumps 10 are arranged between the PRPG 26 and the MISR 28 according to the prior art. Between the LBIST stumps 10 random logic blocks 22 are arranged. Each LBIST stump 10 comprises a plurality of storage elements 14 for unconstrained values as shown in FIG. 7.

Figure 7:
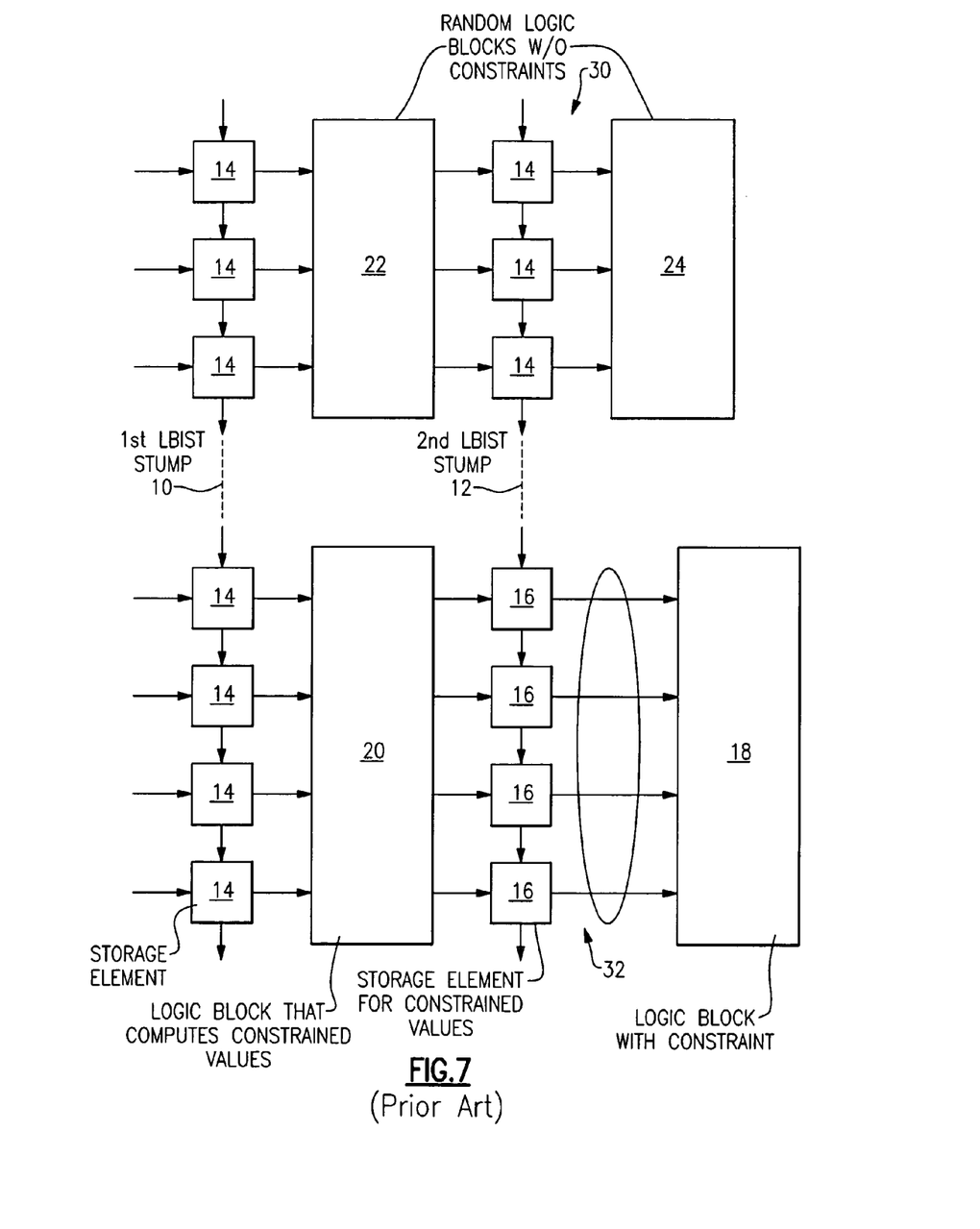
FIG. 7 illustrates a schematic diagram of a part of an integrated circuit with the logic built-in-self-test engine according to the prior art.

FIG. 7 illustrates a schematic diagram of a part of an integrated circuit with the LBIST engine according to the prior art. The integrated circuit includes a first LBIST stump 10 and a second LBIST stump 12. The first LBIST stump 10 comprises a plurality of storage elements 14 for unconstrained values. The second LBIST stump 12 comprises a first portion 30 and a second portion 32. The first portion 30 of the second LBIST stump 12 includes a plurality of storage elements 14 for unconstrained values. The second portion 32 of the second LBIST stump 12 includes a plurality of storage elements 16 for constrained values. The integrated circuit includes further a constrained logic block 18 and three random logic blocks 20, 22 and 24. The constrained logic block 18 requires the constrained input values. The constrained logic block 18 could be the pass-gate multiplexer above, for example, which requires the constrained input values.

The paper "Testing digital circuits with constraints" by Ahmad A. Al-Yamani, Subhasish Mitra and Edward J. McCluskey (Proceeding of the 17th IEEE International Symposium on Defect and Fault Tolerance in VLSI Systems, pages 195-203, 2002) focuses on detecting and resolving illegal states for one-hot constraints by using a logic that is directly added to the circuit under test. However, this method works only for one-hot constraints, but not for arbitrary constraints. Furthermore, this method requires a change of the circuit under test by adding additional resolution logic. Said additional logic increases the complexity of the circuit under test and its critical paths.

The paper "Built-in constraint resolution" by Grady Giles, Joel Irby, Daniela Toneva and Kun-Han Tsai (International Test Conference 2005, IEEE) relates to the maintaining of the correct state for one-hot multiplexer structures and buses. Additional special scan storage elements and an additional decode logic are added to the circuit under test. This method requires an application specific change in the circuit under test. Further, this method requires a high logic complexity.

OBJECT OF THE INVENTION

It is an object of the present invention to provide an improved method and an improved electronic circuit for performing LBIST test cases, which require special constraints on the data values.

SUMMARY OF THE INVENTION

The above object is achieved by a method as laid out in the independent claims. Further advantageous embodiments of the present invention are described in the dependent claims and are taught in the description below.

The core idea of the invention is to re-use functional circuits on the integrated circuit in order to compute legal values. A logic circuit, which is normally used in a functional mode, is used for computing the legal values in a testing mode. With these legal values the constrained parts of the LBIST stumps are updated. This can be achieved by a functional update of the LBIST stumps prior to executing the first LBIST scan and/or update cycle.

The scan process of the LBIST stumps is slightly modified in order to avoid overwriting the well-constrained data during the scan process. This can easily be achieved by a multiplexer that determines, whether the data from the pseudo-random-pattern generator (PRPG) are to be shifted into the LBIST stump or the output of the LBIST stump is to be looped back. The latter mode preserves the well-constrained data in the LBIST stump and can be used for the complete LBIST stump or only for a part of said LBIST stump as a function of a configuration register in the logic of the PRPG.

The method according to the present invention avoids the effort of generating manually designed patterns for the above case. It is not necessary to scan manual patterns into the chip from an external tester. This would be a very slow and costly process.

The present invention allows high fault coverage with a fully automatic LBIST. The required special logic can be seamlessly integrated with the random logic. The method according to the present invention allows a higher speed than manual test patterns. This is very advantageous, since the tester time is costly for high volume products. For the generation of the test patterns no manual efforts are required. The hardware efforts for the integrated circuit according to the present invention are very low. The critical logic paths may be completely controlled and observed.

A design method that leads to an electronic circuit design in accordance with the present invention comprises the following steps. In a first step (step 1), the latches that require constrained input values have to be identified manually (e.g., by the logic designers). In the next step (step 2), this set of latches is then added to one or more LBIST stumps and the loopback logic is implemented (step 3). Steps 2 and 3 can be automated in an electronic design automation (EDA) tool. A simple implementation of such EDA tool performs an isolation of all constrained latches in one single stump that could work in feedback mode only, which would simplify the control logic.

Once the structure of the LBIST stump as well as the control logic has been implemented (steps 1 to 3), the LFSR start/end values for the control logic can be calculated as a function of the position of the constrained registers in each stump. This can be done manually or using an EDA tool.

BRIEF DESCRIPTION OF THE DRAWINGS

The above as well as additional objectives, features and advantages of the present invention will be apparent in the following detailed written description.

The novel and inventive features believed characteristics of the invention are set forth in the appended claims. The invention itself, their preferred embodiments and advantages thereof will be best understood by reference to the following detailed description of preferred embodiments in conjunction with the accompanied drawings, wherein:

DETAILED DESCRIPTION OF THE INVENTION

Figure 1:
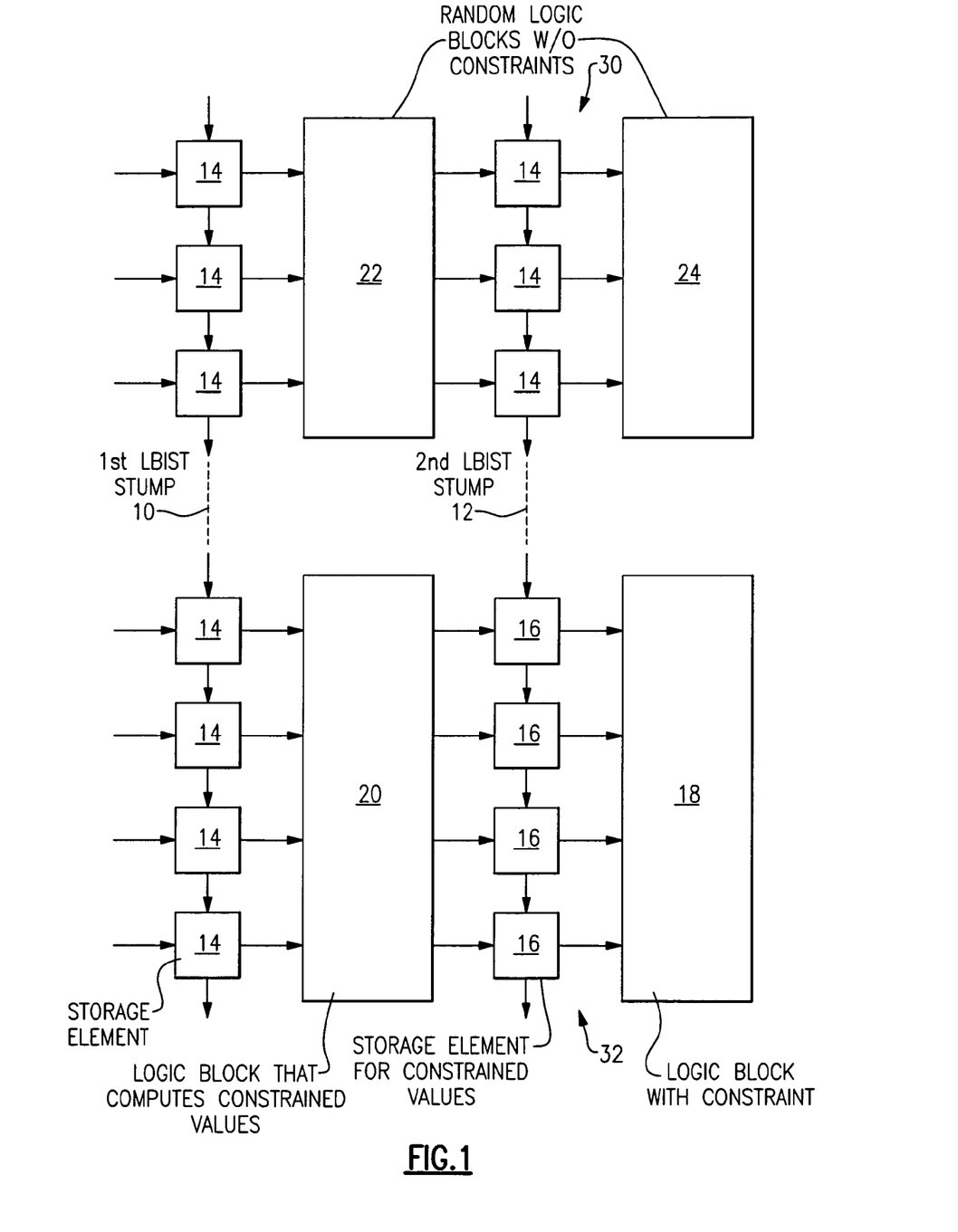
FIG. 1 illustrates schematic diagram of a part of an integrated circuit with a logic built-in-self-test (LBIST) engine according to a preferred embodiment of the present invention.

FIG. 1 illustrates a schematic diagram of a part of an integrated circuit with a logic built-in-self-test (LBIST) engine according to the present invention. The integrated circuit includes a first LBIST stump 10 and a second LBIST stump 12. The first LBIST stump 10 comprises a plurality of storage elements 14 for unconstrained values. The second LBIST stump 12 comprises a first portion 30 and a second portion 32. The first portion 30 of the second LBIST stump 12 includes a plurality of storage elements 14 for unconstrained values. The second portion 32 of the second LBIST stump 12 includes a plurality of storage elements 16 for constrained values. Thus, the second LBIST stump 12 comprises storage elements 14 for unconstrained values as well as storage elements 16 for constrained values. The first LBIST stump 10 comprises only storage elements 14 for unconstrained values in this embodiment.

The storage elements 14 and 16 are scan-able storage elements. Each storage element 14 and 16 includes a scan input, a scan output, a data input and a data output. The storage elements 14 and 16 may be realized as flip-flop elements, for example. The scan output of one storage element 14 or 16 is connected to the scan input the next storage element 14 or 16. In this way a set of storage elements 14 and 16 are serially connected to the first and second LBIST stumps 10 and 12, respectively. Each LBIST stump 10 and 12 form a shift register. The LBIST stumps 10 and 12 may be also referred to as scan chains.

The integrated circuit includes further a constrained logic block 18 and a computing logic block 20. The constrained logic block 18 requires constrained input values. The constrained logic block 18 could be a pass-gate multiplexer or an array, for example. The computing logic block 20 is a random logic block that is already available on the integrated circuit. The computing logic block 20 may be a decoder, for example. The computing logic block 20 is used to compute the constrained values for the storage elements 16.

The outputs of the storage elements 14 for the unconstrained values of a lower part of the first LBIST stump 10 in FIG. 1 are connected to the inputs of the computing logic block 20. The outputs of the computing logic block 20 are connected to the inputs of the storage elements 16 of the second portion 32. The outputs of the storage elements 16 of the second portion 32 are connected to the inputs of the constrained logic block 18.

Thus, the values in the storage elements 10 on the input side of the computing logic block 20 are typically unconstrained. The computing logic block 20 is used to compute well-constrained values for the storage elements 16, which require constrained values.

Normally, according to the prior art the computing logic block 20 is used to compute well-constrained values in the functional mode. According to the present invention the computing logic block 20 is used to compute well-constrained values in the test mode for performing the logic built-in-self-test and may be used additionally in the functional mode.

Further the integrated circuit includes a first random logic block 22 and a second random logic block 24. The first random logic block 22 and the second random logic block 24 are without any constraints. The outputs of the storage elements 14 for the unconstrained values of the upper part of the first LBIST stump 10 in FIG. 1 are connected to the inputs of the first random logic block 22. The outputs of the first random logic block 22 are connected to the inputs of the storage elements 14 of the first portion 30. The outputs of the storage elements 14 of the first portion 30 are connected to the inputs of the second random logic block 24.

Figure 2:
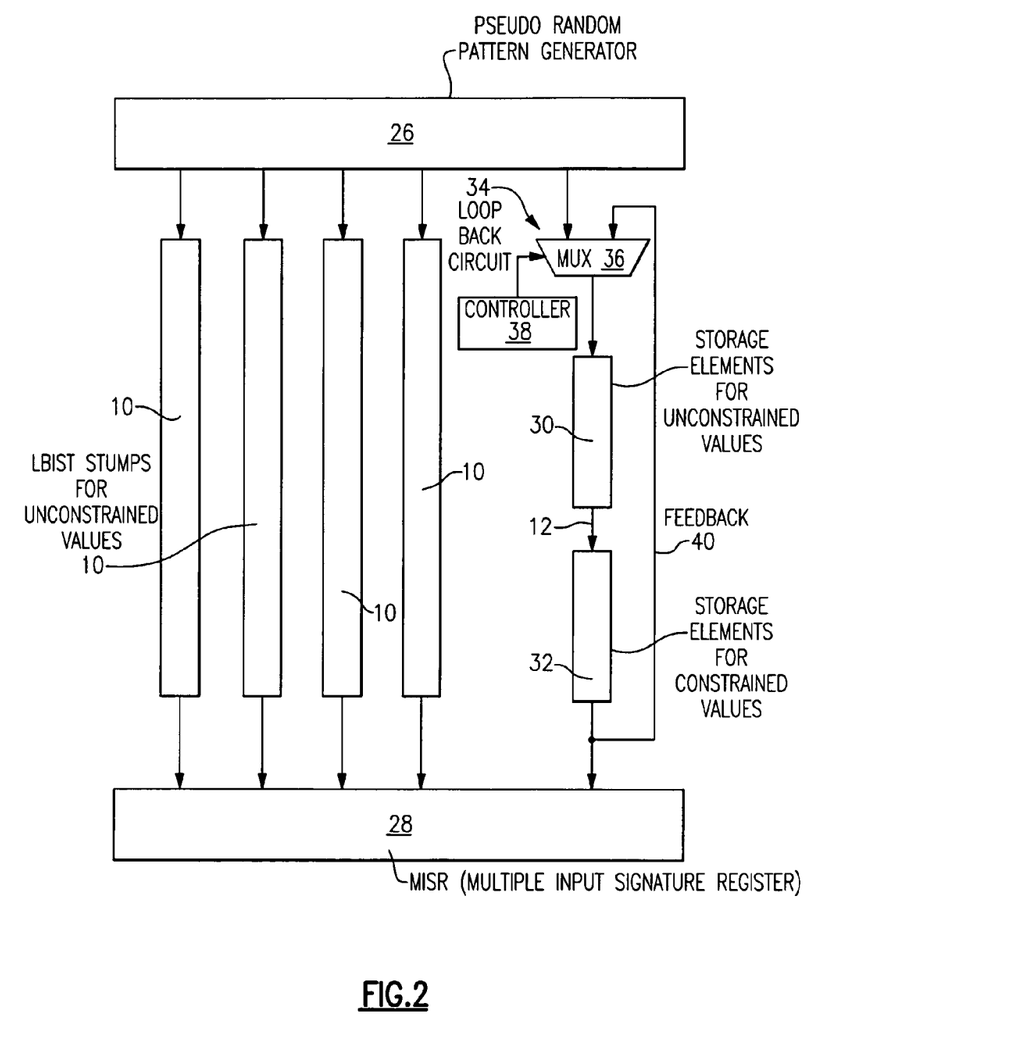
FIG. 2 illustrates a schematic diagram of a number of LBIST stumps arranged between a pseudo-random pattern generator (PRPG) and a multiple-input-signature register (MISR) according to the preferred embodiment of the present invention.

FIG. 2 illustrates a schematic diagram of LBIST stumps 10 and 12 arranged between a pseudo-random pattern generator (PRPG) 26 and a multiple-input-signature register (MISR) 28. In this example a plurality of first LBIST stumps 10 and one second LBIST stump 12 are shown. The PRPG 26 includes a plurality of outputs. The input of each LBIST stump 10 and 12 is connected to one output of the PRPG 26, respectively. The outputs of the LBIST stumps 10 and 12 are connected to the MISR 28. The PRPG 26 and the MISR 28 are also arranged on the integrated circuit. Each LBIST stump 10 comprises a plurality of storage elements 14 for unconstrained values. The LBIST stump 12 comprise in a first portion 30 a plurality of storage elements 14 for unconstrained values and in a second portion 32 a plurality of storage elements 16 for constrained values.

Further a loop back circuit 34 is provided for the second LBIST stump 12. The loop back circuit 34 includes a multiplexer 36, a controller 38 and a feedback line 40. The multiplexer 36 is connected between the PRPG 26 and LBIST stump 12. A first input of the multiplexer 36 is connected to the output of the PRPG 26. A second input of the multiplexer 36 is connected to the output of the second LBIST stump 12 via the feedback line 40. An output of the controller 38 is connected to a select input of the multiplexer 36. The controller 38 is provided to control the behavior of the multiplexer 36 and the loop back circuit 34.

The multiplexer 36 of the loop back circuit 34 selects, whether the PRPG 26 or the feedback of the output of the LBIST stump 12 is used as the scan input for the LBIST stump 12. The loop back circuit 34 is provided to avoid overwriting the well-constrained data after a functional update of a previous LBIST iteration. This is realized by a small number of electronic elements.

Considering the case, in which it should be avoided to overwrite the whole second LBIST stump 12, this would require that the multiplexer 36 feeds back the output of the second LBIST stump 12 for the complete duration of the scan phase. If only one part of the second LBIST stump 12 is supposed to be restored while scanning, then the controller 38 computes the select input of the multiplexer 36 as a function of the scan cycle.

Figure 3:
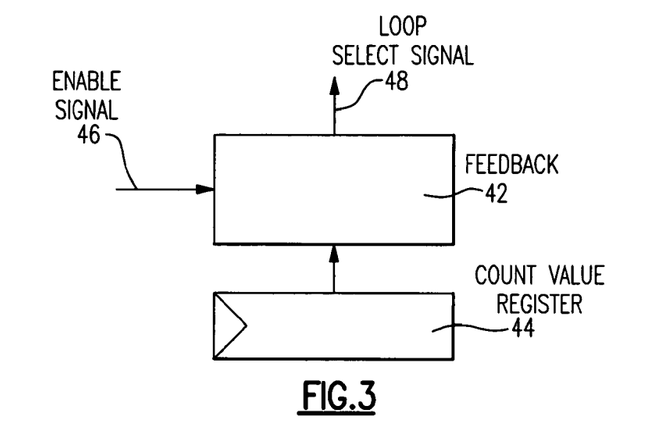
FIG. 3 illustrates a schematic diagram of a controller 38 for the logic built-in-self-test engine according to the preferred embodiment of the present invention.

FIG. 3 illustrates a schematic diagram of a preferred embodiment of the controller 38 according to FIG. 2. The controller 38 includes a linear feedback shift register (LFSR) counter 42 and a start value register 44. The LFSR counter 42 includes an enable input 46 and an output 48. The LFSR counter 42 is loaded with a programmable or fixed start value from the start value register 44, when the scan process starts. When all registers in the LFSR counter 42 have the logical value "one", an overflow condition occurs and the LFSR counter 42 stops. In this case a loop-select-signal on the output 48 of the LFSR counter 42 is asserted and changes the input of the LBIST stump 12 accordingly from one position to the other.

For the above mentioned controller 38 different embodiments are possible. Instead of the LFSR counter 42 other embodiments of a counter are possible. For example, one or more binary counters with a comparator may be used. If the constrained storage elements 16 in FIG. 1 are not contiguous, then more than one LFSR counters 42 may be provided.

A sequence of the LBIST procedure comprises the following steps. In the beginning a first LBIST iteration is performed. All the LBIST stumps 10 and 12 are scanned with the PRPG 26. Thereby the storage elements 14 for the unconstrained values as well as the storage elements 16 for the constrained values are initialized. This might violate some constraints for a short time. Since this intermediate state will not take very long, it is assumed that the circuit tolerates these illegal settings. Otherwise a specials protection logic circuit, which is already used in typical circuits, needs to be activated in this step. The MISR 28 is deactivated while scanning, since the output values of the LBIST stump 12 at this time are non-deterministic. One or more functional update cycles are performed in order to propagate legal values into all storage elements 16 that require constrained values.

Next it is waited a certain time, which is long enough to allow the circuit and/or the voltage to recover from the illegal values of the step above after the first LBIST scan operation. If the protection logic circuit has been activated in the step above, then it is deactivated in this step.

In a further step the MISR 28 is activated and the LFSR start value in the register 44 of the controller 38 is programmed, which has to be done before each scan phase. Then as many regular LBIST sequences as needed are run in order to get the desired test coverage. At last the MISR 28 is read out and compared with proper reference values.

Figure 4:
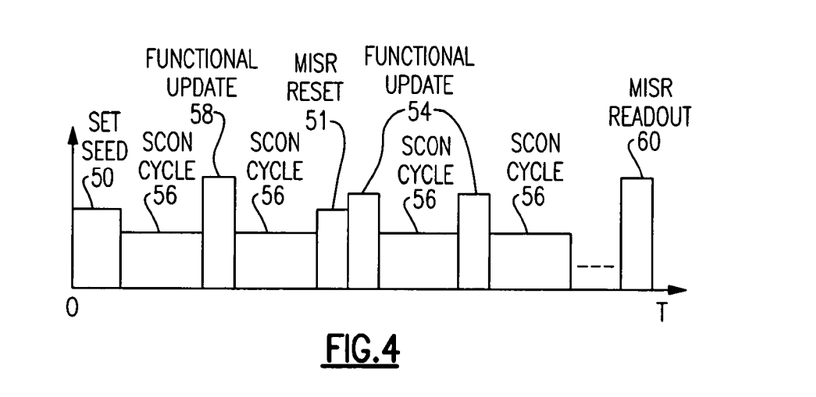
FIG. 4 illustrates a schematic diagram of the time development of the LBIST procedure according to the preferred embodiment of the present invention.

FIG. 4 illustrates a schematic timing diagram of the LBIST procedure according to the present invention. In a first step 50 a seed is set in order to initialize the PRPG 26 in FIG. 2. Then a scan cycle 56 is performed in order to scan all the LBIST stumps 10 and 12 in FIG. 2. After that a special functional update 58 and another scan cycle 56 are performed. In a next step 51 the MISR 28 is reset. Then several conventional iterations comprised of one or more functional updates 54 and scan cycles 56 are performed. The sequence could start with either the functional update 54 or the scan cycle 56 and typically ends with a scan cycle 56. In a last step 60 the signature in the MISR 28 is read out and compared with proper reference signatures in order to identify any failures on the chip.

Other configurations for the timing diagram in FIG. 4 are also possible. For example, the reset of the MISR 28 could be done earlier in the sequence, i.e. at time 0. For this case, the MISR operation has to be disabled until the second scan cycle 56 in FIG. 4.

Figure 5:
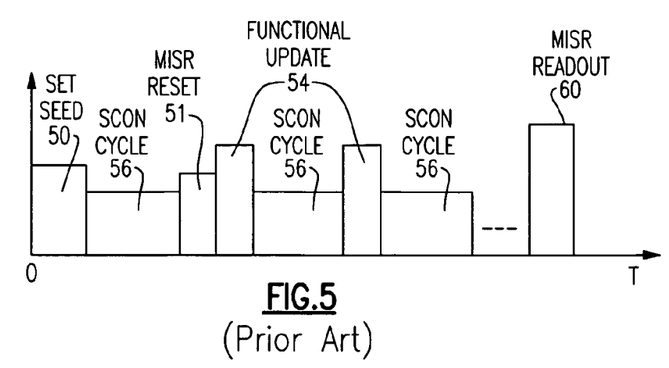
FIG. 5 illustrates a schematic diagram of the time development of the logic built-in-self-test procedure according to the prior art.

FIG. 5 illustrates a schematic diagram of the time development of the LBIST procedure according to the prior art. The comparing of FIG. 4 and FIG. 5 shows the difference of the LBIST processes between the present invention and the prior art. In the LBIST process according to the prior art there is no special functional update 58 between the first scan cycle 56 and the step of resetting 51 the MISR 28 and one additional scan cycle 56 is missing.

In the LBIST process according to the present invention in the special functional update 58 after the first scan cycle 56 the computing logic block 20 computes the legal constrained values that are stored in the lower part 32 of the LBIST stump 12 in FIG. 2.

It is assumed that the LBIST stump 12 in FIG. 2 is the longest LBIST stump. If the LBIST stump 12 is not the longest LBIST stump, then preferably an additional control logic circuit needs to be provided. If the LBIST stump 12 has a number of M storage elements, then said additional control logic circuit stops the scanning of the LBIST stump 12 exactly after M cycles in order to make sure, that loop back circuit 34 is able to restore the state of the second portion 32 in the LBIST stump 12 properly. Another comparator of about 10 bit to 12 bit for the LSFR counter 44 is enough in order to stop shifting this LBIST stump 12 after exact M scan clocks, assuming typical LBIST stump lengths are in the order of 1000 to 4000 storage elements.

For preferred practical design purposes the following sequence of tasks may be provided. At first a critical part of the circuit has to be identified, which requires constrained input values and for which the LBIST is desirable.

Next the associated storage elements have to be added to one or more LBIST stumps 10 and 12. A logic circuit is added in order to implement the loop back circuit 34 according to FIG. 2. The easiest solution would be to isolate all the storage elements 16 for constrained values in one single LBIST stump 12. In this case said single LBIST stump 12 can work in the feedback mode all the time without any additional multiplexer and/or control logic. In the more general case, if the storage elements 16 for constrained values are in more than one LBIST stump 12, then the loop back circuit 34 preferably has to be replicated.

Once the storage elements 16 for constrained values have been identified in one stump, the start value in the LSFR register 44 can be calculated statically as a function of the position of the storage elements 16 for constrained values within the LBIST stump 12.

This design approach can be summarized as a method for implementing an LBIST in a design of an electronic circuit comprising the steps of:

determining a list of storage elements of said design that require constraint input signals;

arranging the storage elements from said list in a first portion of one or more LBIST stumps;

arranging the storage elements interconnected with the storage elements from said list in a second portion of said LBIST stumps;

arranging said LBIST stumps in one or more loop back circuits between a pseudo-random-pattern generator and a multiple-input-signature register.

For special embodiments of the present invention a protection logic circuit is provided for the integrated circuit. Such protection logic circuits are well known in the state of the art. For example, the protection logic circuit is used for a pass-gate multiplexer. The pass-gate multiplexer has the potential to create short circuits. Those short circuits could result in severe damage or at least in reliability problems. The protection logic circuit is especially needed, if it can not be guaranteed to have correctly running clocks all the time. For example, the clock is not running all the time during the power-on-reset sequence. In the case of the pass-gate multiplexer, the protection logic circuit has to make sure that short circuits are avoided, either by enforcing the same data as multiplexer inputs or by enforcing a correct one-hot or all-zero signal as a multiplexer control input. During all the above scan phases the protection logic circuit should be activated in order to avoid transient illegal values to the storage elements 16 for constrained values.

FIG. 6 illustrates a schematic diagram of a conventional LBIST structure. A number of LBIST stumps 10 are arranged between the PRPG 26 and the MISR 28 according to the prior art. Between the LBIST stumps 10 the random logic blocks 22 are arranged. Each LBIST stump 10 comprises a plurality of the storage elements 14 for unconstrained values.

FIG. 7 illustrates a schematic diagram of a part of an integrated circuit with the LBIST engine according to the prior art. The integrated circuit includes the first LBIST stump 10 and the second LBIST stump 12. The first LBIST stump 10 comprises the plurality of the storage elements 14 for unconstrained values. The second LBIST stump 12 comprises the first portion 30 and the second portion 32. The first portion 30 of the second LBIST stump 12 includes the plurality of storage elements 14 for unconstrained values. The second portion 32 of the second LBIST stump 12 includes the plurality of storage elements 16 for constrained values. The integrated circuit includes further the constrained logic block 18 and three random logic blocks 22. The constrained logic block 18 requires constrained input values. The constrained logic block 18 could be a pass-gate multiplexer or an array, for example.

The present invention can be realized in hardware, software, or a combination of hardware and software. Any kind of computer system or other apparatus adapted for carrying out the methods described herein is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods.

Computer program means or computer program in the present context mean any expression, in any language, code or notation, of a set of instructions intended to cause a system having an information processing capability to perform a particular function either directly or after either or both of the following a) conversion to another language, code or notation;

b) reproduction in a different material form.

Furthermore, the method described herein may take the form of a computer program product accessible from a computer-usable or computer-readable medium providing program code for use by or in connection with a computer or any instruction execution system. For the purposes of this description, a computer-usable or computer readable medium may be any apparatus that can contain, store, communicate, propagate, or transport the program for use by or in connection with the instruction execution system, apparatus, or device. The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk, read only memory (CD-ROM), compact disk, read/write (CD-RW), and DVD.

LIST OF REFERENCE NUMERALS 10 first LBIST stump
12 second LBIST stump
14 storage elements for unconstrained values
16 storage elements for constrained values
18 constrained logic block
20 computing logic block
22 first random logic block
24 second random logic block
26 pseudo-random pattern generator (PRPG)
28 multiple input signature register (MISR)
30 first portion of the second LBIST stump
32 second portion of the second LBIST stump
34 loop back circuit
36 multiplexer
38 controller
40 feedback line
42 linear feedback shift register (LFSR) counter
44 start value register
46 enable input
48 output
50 step of setting the seed
51 step of resetting the MISR
54 conventional functional update
56 scan cycle 58 special functional update
60 step of reading out the signature

The invention claimed is:

1. A method for performing, using instructions stored on non-transitory computer readable medium, a logic built-in self-test (LBIST) on an electronic circuit with a plurality of logic circuits and storage elements and connected serially to a number of LBIST stumps between a pseudo-random-pattern generator and a multiple-input-signature register, wherein at least one constrained logic circuit requires constrained values as input signals and said method comprises the following steps:

scanning the LBIST stumps with the pseudo-random-pattern generator, deactivating or resetting the multiple-input-signature register, performing a functional update in order to propagate legal values into those storage elements, which require constrained values, activating the multiple-input-signature register, and setting or programming a start value in a counter for activating a loop back circuit (34) in order to avoid an overwriting of well-constrained values computed by said logic circuits and stored in the storage elements.

2. The method according to claim 1, wherein in a last step content of the multiple-input-signature register is read out in order to compare the content with reference values.

3. The method according to claim 2, wherein said content of the multiple-input-signature register is compared with reference values in order to identify any failures on the integrated circuit.

4. The method according to claim 1, wherein after a first scanning of the LBIST stumps a protection logic circuit, which is already available on the integrated circuit, is activated.

5. The method according to claim 4, wherein the protection logic circuit is deactivated after performing a first functional update.

6. The method according to claim 1, wherein a seed is set in the beginning in order to initialize the pseudo-random-pattern generator.

7. The method according to claim 1, wherein after resetting the multiple-input-signature register several conventional iterations are performed.

8. The method according to claim 7, wherein said conventional iterations comprise one or more functional updates and scan cycles.

9. An electronic circuit with at least one logic built-in self-test (LBIST) engine and a plurality of storage elements and logic circuits, wherein the scan-able storage elements are interconnected to a number of LBIST stumps according to a predetermined scheme, the logic circuits are connected to the LBIST stumps according to a predetermined scheme, at least one constrained logic circuit requires constrained values as input signals, at least one computing logic circuit is provided to compute the constrained values, and at least one loop back circuit is provided for the LBIST stump with from the storage elements used for storing constrained values.

10. The electronic circuit according to claim 9, wherein the logic built-in self-test engine comprises a pattern generator for creating the patterns for the LBIST stumps.

11. The electronic circuit according to claim 10, wherein the pattern generator is a pseudo-random pattern generator.

12. The electronic circuit according to claim 9, wherein the logic built-in self-test engine comprises a multiple-input-signature register for receiving the signals from the LBIST stumps.

13. The electronic circuit according to claim 9, wherein the loop back circuit comprises a multiplexer and a feedback line.

14. The electronic circuit according to claim 13, wherein the multiplexer selects between the output of said LBIST stump and the output of the pattern generator for the input of the LBIST stump.

15. The electronic circuit according to claim 9, wherein the integrated circuit includes a protection logic circuit in order to avoid transient illegal values to the storage elements for constrained values.

16. The electronic circuit according to claim 15, wherein the protection logic circuit is provided to enforce the same data as input of the multiplexer.

17. The electronic circuit according to claim 16, wherein the protection logic circuit is provided to enforce a correct one-hot or all-zero signal as control input of the multiplexer.

18. A method for implementing, using instructions stored on non-transitory computer readable medium, a logic built-in self test (LBIST) in an electronic circuit design with a plurality of logic circuits and storage elements, wherein a list of storage elements of said design that require constraint constrained input signals is provided, the method being characterized by the steps of:

arranging the storage elements from said list in a first portion of one or more LBIST stumps;

arranging the storage elements interconnected with the storage elements from said list in a second portion of said LBIST stumps;

arranging said LBIST stumps in one or more loop back circuits between a pseudo-random-pattern generator and a multiple-input-signature register.

* * * * *